(12) United States Patent
Erlbacher

(10) Patent No.: US 12,113,096 B2
(45) Date of Patent: Oct. 8, 2024

(54) METHOD FOR PRODUCING SEMICONDUCTOR CAPACITORS HAVING DIFFERENT CAPACITANCE VALUES IN A SEMICONDUCTOR SUBSTRATE

(71) Applicant: FRAUNHOFER-GESELLSCHAFT ZUR FOERDERUNG DER ANGEWANDTEN FORSCHUNG E.V., Munich (DE)

(72) Inventor: Tobias Erlbacher, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/585,121

(22) Filed: Sep. 27, 2019

(65) Prior Publication Data
US 2020/0111864 A1    Apr. 9, 2020

(30) Foreign Application Priority Data
Oct. 4, 2018    (DE) .................... 10 2018 217 001.0

(51) Int. Cl.
*H01L 21/768* (2006.01)
*H01L 49/02* (2006.01)

(52) U.S. Cl.
CPC ............ *H01L 28/40* (2013.01); *H01L 21/768* (2013.01)

(58) Field of Classification Search
CPC ............ H01L 29/66181; H01L 29/945; H01L 23/642; H01L 21/768; H01L 28/40;
(Continued)

(56) References Cited

U.S. PATENT DOCUMENTS 5,866,452 A * 2/1999 Willer .................. H01L 28/82
                                                          438/243
6,709,947 B1 * 3/2004 Wrschka ................ H01L 28/84
                                                          438/398
(Continued)

OTHER PUBLICATIONS

Wikipedia, the free encyclopedia; *Doping (semiconductor)*; Archive Aug. 31, 2018; https://web.archive.org/web/20180831082153/https://en.wikipedia.org/wiki/Doping_(semiconductor).

*Primary Examiner* — Kyoung Lee
*Assistant Examiner* — Christina A Sylvia
(74) *Attorney, Agent, or Firm* — Renner, Kenner, Greive, Bobak, Taylor & Weber

(57) ABSTRACT

In a method for producing semiconductor capacitors having different capacitance values on a common substrate, firstly a partially processed semiconductor substrate is produced as a semi-finished product with hole structures and filled with a layer sequence of a dielectric and an electrically conductive layer—independently of the semiconductor capacitors to be produced subsequently. The production of the semiconductor capacitors having different capacitance values only then takes place in a second production phase by corresponding metallization and structuring. The semiconductor capacitors are then separated along dividing regions through which different groups of holes are separated from one another during the production of the semi-finished product. The method enables a more cost-effective production of semiconductor capacitors having different capacitance values in small numbers of items in make-to-order fabrication (foundry process).

2 Claims, 3 Drawing Sheets

(58) Field of Classification Search
CPC ... H01L 21/78; H01L 23/647; H01L 27/0288; H01L 21/76898; H01L 27/0207; H01L 20/945
See application file for complete search history.

(56) References Cited

U.S. PATENT DOCUMENTS

| | | | |
|---|---|---|---|
| 7,738,226 B2 | 6/2010 | Berberich et al. | 361/91.7 |
| 8,143,659 B2 | 3/2012 | Pompl | 257/301 |
| 8,563,388 B2 | 10/2013 | Berberich | 438/381 |
| 2008/0122031 A1* | 5/2008 | DeNatale | H01L 23/49827 257/532 |
| 2009/0174031 A1* | 7/2009 | Wang | G11C 11/404 257/532 |
| 2009/0256239 A1* | 10/2009 | Pompl | H01L 29/66181 257/535 |
| 2010/0308435 A1* | 12/2010 | Nowak | H01L 28/60 257/532 |
| 2011/0090615 A1 | 4/2011 | Sato et al. | 361/301.4 |
| 2011/0318852 A1* | 12/2011 | Viswanadam | H01L 21/76898 438/18 |
| 2012/0007178 A1* | 1/2012 | Oota | H01L 29/7811 257/334 |
| 2013/0200534 A1* | 8/2013 | Shiobara | B32B 5/00 257/787 |
| 2014/0035158 A1* | 2/2014 | Chang | H01L 25/50 438/109 |
| 2014/0175541 A1* | 6/2014 | Matri' | H01L 21/82 257/334 |
| 2015/0028450 A1* | 1/2015 | Park | H01L 21/76898 257/532 |
| 2015/0145104 A1* | 5/2015 | Bauer | H01L 21/283 438/381 |
| 2017/0025349 A1* | 1/2017 | Wood | H01L 23/544 |
| 2019/0161342 A1* | 5/2019 | Tai | B81C 1/00333 |
| 2019/0229180 A1* | 7/2019 | Lin | H01L 21/02573 |

* cited by examiner

METHOD FOR PRODUCING SEMICONDUCTOR CAPACITORS HAVING DIFFERENT CAPACITANCE VALUES IN A SEMICONDUCTOR SUBSTRATE

TECHNICAL FIELD OF APPLICATION

The present invention relates to a method for producing semiconductor capacitors having different capacitance values in a semiconductor substrate, in particular for carrying out in a foundry process.

Many semiconductor components are fabricated specifically in smaller numbers of items frequently by make-to-order fabrication in semiconductor works, so-called foundries. As a result of the small numbers of items, in this case semiconductor components having different specifications must usually be produced on the same semiconductor substrate. This necessitates specifying the overall mask design for the different semiconductor components before the beginning of fabrication, which can only begin after this specification has been made.

PRIOR ART

Thus, for example, U.S. Pat. No. 7,738,226 B2 discloses a structure of an RC snubber member which is fabricated by means of conventional chip fabrication. The production of such snubber members requires a definition of the mask design including curves, metal surfaces etc. before production. The capacitance and resistance value of the RC snubber member must therefore in this case already be specified before the beginning of the fabrication process.

U.S. Pat. No. 8,563,388 B2 discloses a fabrication method for RC snubber members in which initially a uniform hole structure is produced in the semiconductor substrate and filled with a dielectric layer which extends between the individual holes. In this first production phase, any delimitation between individual capacitors or RC snubber members to be produced is dispensed with. The capacitance values of the individual capacitors and therefore also the boundaries of these capacitors on the semiconductor only specified subsequently in a second substrate are production phase by application of a structured metallization. Finally a separation of the individual capacitors or RC snubber members then takes place in which the dividing lines then run partly through existing holes.

DESCRIPTION OF THE INVENTION

The object of the present invention is to provide a method for producing semiconductor capacitors having different capacitance values on a common semiconductor substrate, which enables a cost-effective fabrication of capacitors or also RC snubber members having customer-specific electrical properties.

The object is solved by the method according to patent claim 1. Advantageous embodiments of the method are the subject matter of the dependent patent claims or can be deduced from the following description and the exemplary embodiments.

The proposed method for producing semiconductor capacitors having different capacitance values in a low-resistance semiconductor substrate is divided into two production phases. In the first production phase independently of the semiconductor capacitors to be produced in the semiconductor substrate, several groups of holes are produced in the semiconductor substrate, which are distributed over the semiconductor substrate and in each case are separated from one another by means of identifiable dividing regions. The dividing regions have a width (distance between the respective groups) which is greater than the spacing of the holes within the groups, i.e., in particular is greater than 5 µm. In turn, independently of the semiconductor capacitors to be produced in the semiconductor substrate, this hole structure is filled with a layer sequence of a dielectric and an electrically conductive layer, for example of a metal or of polysilicon, as subsequent upper electrode of the semiconductor capacitors, wherein the layer sequence also extends between the holes and groups of holes. Each of the group of holes forms a capacitance due to this layer sequence, hereinafter designated as first capacitance to distinguish with respect to the capacitance of the semiconductor capacitor to be produced. With this semi-finished product thus obtained, the partially processed semiconductor substrate with the hole structure and the coating, the second production phase is then carried out in which the semiconductor capacitors to be produced in the semiconductor substrate are firstly specified. This is accomplished by dividing the semiconductor substrate into different subregions in which semiconductor capacitors having identical capacitance values are produced in each case. The capacitance values of the semiconductor capacitors of the various subregions differ here. The layer sequence applied in the first production phase is then structured and a metallization is applied structured or is applied and then structured. The structuring of the layer sequence and the application and/or structuring of the metallization are accomplished so that within each subregion the semiconductor Capacitors having the desired capacitance value are obtained either in each case by one of the first capacitances themselves, if these already correspond to the desired capacitance value, or by electric parallel connection of a suitable number of the first capacitances. The structuring of the layer sequence can in this case also merely comprise a structuring of the electrically conductive layer of the layer sequence. A structuring is understood in this context as a separation of the respective layer into different regions which are separate from one another, for example, by etching away regions of the layer. Therefore the electrical properties or capacitance values as well as the number of semiconductor capacitors having a respective capacitance value to be produced on the semiconductor substrate must only be specified for this second production phase. The semiconductor capacitors of each subregion are then separated by separating the semiconductor substrate along dividing lines which run within the dividing regions specified in the first production phase. Naturally in the second production phase, further layers can also be applied to the semiconductor substrate before the separation if required.

As a result of this separation of the production process into the two production phases combined with the use of the existing dividing regions, an efficient and cost-effective fabrication of semiconductor capacitors having different capacitance values is achieved in the production process without the capacitance values of the capacitors needing to be specified already before the beginning of the production process. In particular, the make-to-order fabrication in a foundry can be implemented more cost-effectively with the proposed method since independently of the incoming orders, a plurality of semi-finished products (partially processed semiconductor substrates) can already be produced with the process steps of the first production phase. Since the process steps here do not differ from one semi-finished product to another semi-finished product, this production can be carried out very cost-effectively. The fabrication of components having customer-specific electrical properties (individualization) is then only accomplished in the second production phase in which the previously produced semi-finished products are used. Due to the preceding specification of dividing regions in the first production phase, damage to the components is avoided in the subsequent separation since no holes must be cut through directly following the active regions.

The dividing regions are in this case preferably selected in the first production phase so that they each extend rectilinearly over the entire semiconductor substrate. In these dividing regions in a preferred embodiment of the proposed method, in the first production phase holes or recesses are also produced which are configured for stress migration by minimizing the planar surface of the semiconductor substrate. As a result, stresses between the layer and the semiconductor substrate are reduced when depositing thicker layers or layer sequences on the semiconductor substrate. The holes or recesses are thereby arranged or configured so that the dividing regions remain identifiable with respect to the groups of holes. This can be accomplished by different dimensioning or spacing of the holes of these dividing regions or by maintaining an identifiable distance between the holes of the dividing regions and the holes of the individual groups.

RC snubber members such as are already known, for example from the already-mentioned U.S. Pat. No. 7,738,226 B2 can also be produced with the proposed method. For this purpose, in a proposed embodiment before the separation, the semiconductor substrate is connected to a second semiconductor substrate, which has a lower sheet resistance than the semiconductor substrate having the semiconductor capacitors due to a lower doping. Preferably a metallization of the free side of this second semiconductor substrate is then carried out. As a result of the connection to the second semiconductor substrate, a series circuit comprising a semiconductor capacitor and a resistance specified by the second semiconductor substrate is formed in each case. Then, this semiconductor stack is again separated to form the individual RC snubber members.

In an alternative embodiment, before separation the semiconductor substrate can also be provided with a backside layer which has a lower sheet resistance than the semiconductor substrate with the semiconductor capacitors in order to produce RC snubber members. Also in this embodiment, preferably again after application of a backside metallization, the subsequent separation then takes place to form the individual RC snubber members.

BRIEF DESCRIPTION OF THE DRAWINGS

The proposed method is explained once again hereinafter with reference to exemplary embodiments in conjunction with the drawings. In the figures.

WAYS FOR IMPLEMENTING THE INVENTION

With the proposed method, semiconductor capacitors, in particular silicon capacitors, having different electrical characteristics can be produced on a common semiconductor substrate, wherein in a first production phase a partially processed semiconductor substrate is produced as semi-finished product, which is constructed independently of the different electrical characteristics or capacitance values of the semiconductor capacitors to be produced. Using the method, for example, semiconductor capacitors can be produced, as shown for example in FIG. 1 or also RC snubber members comprising such semiconductor capacitors.

Figure 1:
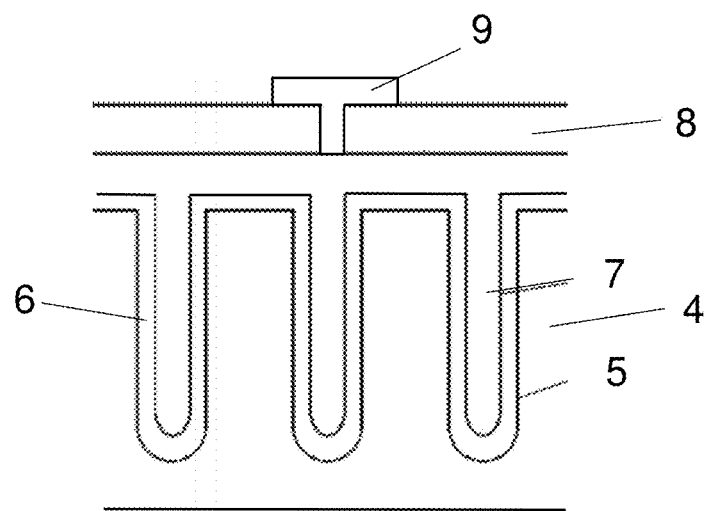
FIG. 1 shows an example for the construction of a semiconductor capacitor such as can be produced with the proposed method.

FIG. 1 shows a section of a semiconductor substrate 4 in cross-section, in the surface of which a hole structure with holes 5 is etched, which serve as the basis for the capacitor to be produced. The semiconductor substrate 4 has a high doping, for example, a boron doping, of at least $5*10^{18}$ cm$^{-3}$ and therefore a low ESR (equivalent series resistance). The holes 5 can be produced by known mask and etching technology. The holes 5 are then filled with a layer sequence of a dielectric 6 and a metal 7 which forms the upper electrode of the capacitor. This is followed by the deposition of an insulating layer 8 and a further metallization 9 which is used for the front-side contacting of the semiconductor capacitor. The backside of the semiconductor substrate 4 can also be provided with a corresponding metallization. The capacitance value of the semiconductor capacitor produced in this way in this case depends inter alia on the number of holes 5 or the area size of the hole structure. Hitherto, a usual chip fabrication method has been used to produce such semiconductor capacitors, in which the definition of the mask design for the capacitors to be produced is specified before the beginning of fabrication so that the capacitance values of the individual capacitors must also be known before the beginning of fabrication.

With the present method, the specification before the beginning of the production process is no longer necessary. On the contrary, semi-finished products can be produced in large numbers initially with exactly the same structures. The fabrication of semiconductor capacitors having different capacitance values then takes place on the same semiconductor substrate using these semi-finished products.

For this purpose, in the proposed method in a first production phase in which the semi-finished product is produced, a hole structure with holes is produced in the semiconductor substrate which extend over the entire semiconductor substrate. In the proposed method these holes are produced in separate groups using a mask and etching technique in the semiconductor substrate, wherein after the subsequent deposition of a layer sequence of dielectric and metal, each group forms a capacitance, here designated as first capacitance to distinguish with respect to the capacitance of the semiconductor capacitor to be produced.

Figure 2:
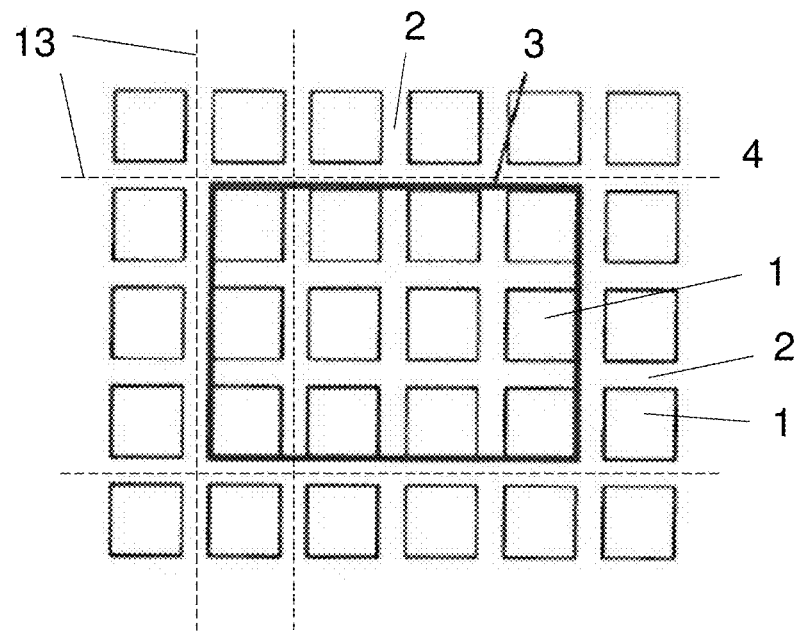
FIG. 2 shows a schematic diagram of a distribution of the groups of holes over the semiconductor substrate according to the proposed method.

FIG. 2 shows to this end in highly schematic view a plan view of a section of the semiconductor substrate 4, in which the individual groups 1 of holes occupy an approximately square area and are indicated by the small squares in the figure. The groups 1 of holes can also be approximated by different geometrical shapes, for example, rectangles or triangles. It can also be seen from FIG. 2 that dividing regions 2, identifiable by dividing lines 13, are provided between the individual groups 1, which separate the individual groups 1 from one another and subsequently serve as dicing streets during the separation of the semiconductor capacitors. Following the production of the hole structure, a layer sequence of a dielectric and a metal is deposited on the semiconductor substrate by means of which the holes are filled in the known manner. This layer sequence is applied over the entire semiconductor substrate 4, i.e. over the dividing regions 2 between the individual groups 1, i.e. independently of the capacitance values of the capacitors to be produced subsequently.

Using the partially processed semiconductor substrate obtained in this way, also designated in the present patent application as semi-finished product, the second production phase is then carried out in which the individual semiconductor capacitors with the desired capacitance values are obtained. To this end, subregions 3 are specified within which a number of semiconductor capacitors having identical capacitance values is to be produced in each case. The size of these subregions 3 depends on the number and the capacitance values of the semiconductor capacitors to be produced. In FIG. 2 such a subregion 3 is only indicated schematically. Other subregions then in turn relate to semiconductor capacitors having different capacitance values. In the respective subregions 3, semiconductor capacitors which have the required number of groups 1 of holes for the desired capacitance are then produced in the second production phase by metallization and structuring. To this end, the individual first capacitances of the groups 1 of holes are switched in parallel in suitable number by the structuring and metallization. This requires a mask design matched to the respective capacitance value. This is then followed by the separation of the individual capacitors in the corresponding subregion 3 along the dividing regions 2.

Figure 3:
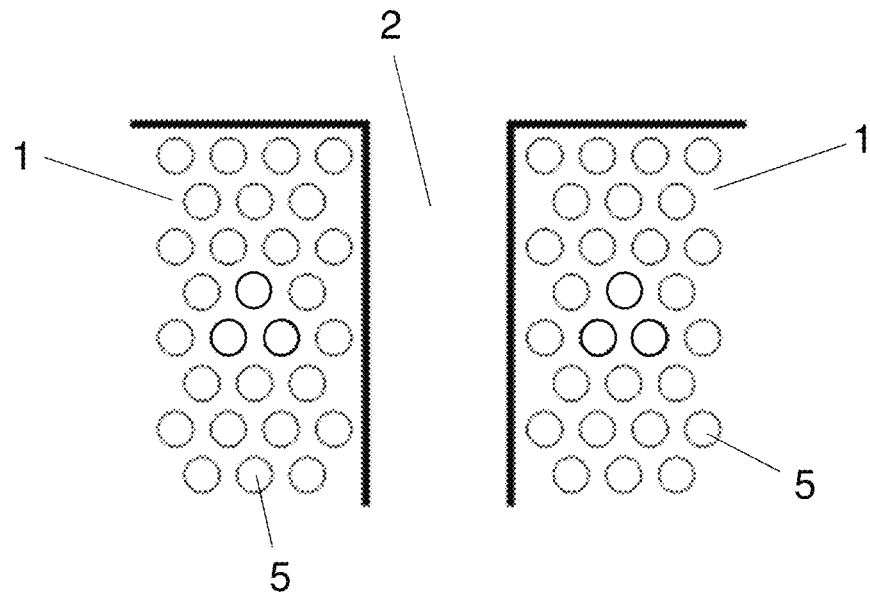
FIG. 3 shows an enlarged view of a section from FIG. 2 according to a first embodiment.

To this end, FIG. 3 again shows an enlarged view of a section from FIG. 2 in which the individual holes 5 of the groups 1 can be identified. The dividing regions 2 between hole structures 1 here have no holes.

Figure 4:
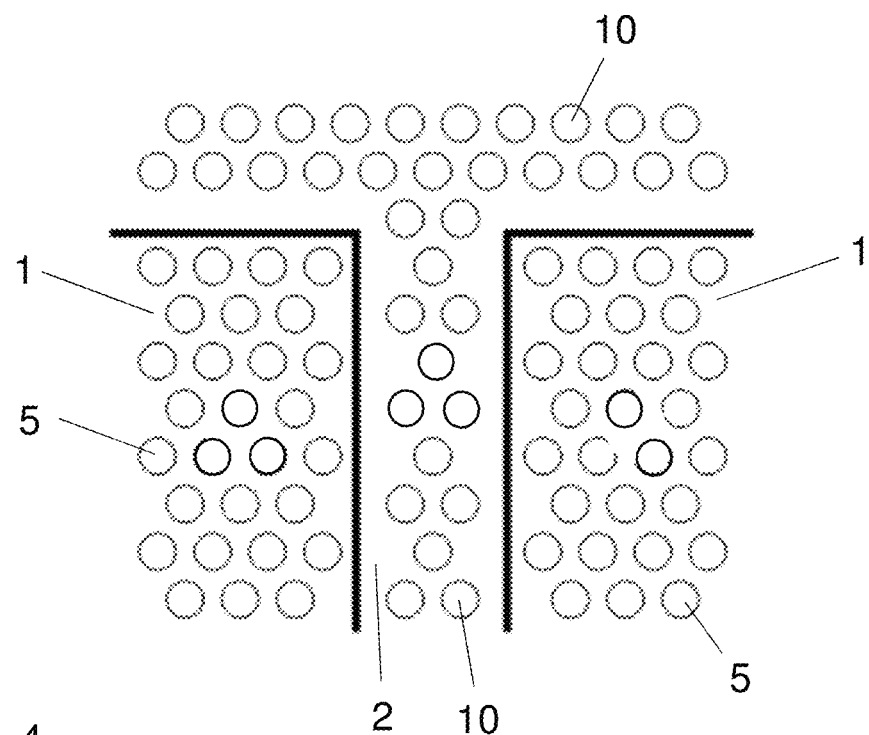
FIG. 4 shows an enlarged view of a section from FIG. 2 according to a second embodiment.

In a further embodiment however, corresponding recesses or holes can also be produced in the dividing regions 2, as shown schematically in FIG. 4. The holes 10 in these dividing regions 2 are arranged in this example as a result of a correspondingly enlarged distance from the groups 1 of holes 5 such that the individual dividing regions 2 and groups 1 of holes can still be identified. As a result of these additional holes 10 in the dividing regions 2, a stress migration is achieved so that when applying thicker layers to the semiconductor substrate, stresses between the layers and the semiconductor substrate are reduced in this region.

As a result of the hole structuring and the filling with a dielectric and a metal as upper electrode in the first production phase with a fixedly defined mask design which is independent of the semiconductor capacitors to be produced subsequently, the semi-finished product can be produced cost-effectively in a large quantity regardless of the semiconductor capacitors to be produced. The individualization or production of the semiconductor capacitors having different capacitance values is then only accomplished in the second production phase. In this second production phase, the dielectric and/or the upper electrode are structured and a metallization is produced over a part of the individual regions or groups in order to form the semiconductor capacitors with the corresponding capacitance values. This is then accomplished with an individually defined mask design in each case.

As a result of the parallel wiring of the hole structures of several of the groups 1, most diverse capacitance values can thus be obtained. Thus, for example, the semi-finished product can be produced by processing on a low-resistance p-substrate. The dimensioning of the area of the groups 1 can be accomplished in this case, for example so that if an area of each group 1 is 0.5 mm$^2$ and a first capacitance value of this group is 250 pF, capacitance values C of 1 to 10 nF can be obtained by parallel wiring of several of the groups. This is shown in the following table which shows the total area A and the total numbers of the parallel-wired groups 1 in each case.

| | C in nF | | | | | | |
|---|---|---|---|---|---|---|---|
| | 1 | 1.5 | 3.0 | 4.5 | 5.0 | 5.5 | 10 |
| A in mm$^2$ | 2 | 3 | 6 | 9 | 10 | 12 | 20 |
| Number of groups | 4 | 6 | 12 | 18 | 20 | 24 | 40 |

Figure 5:
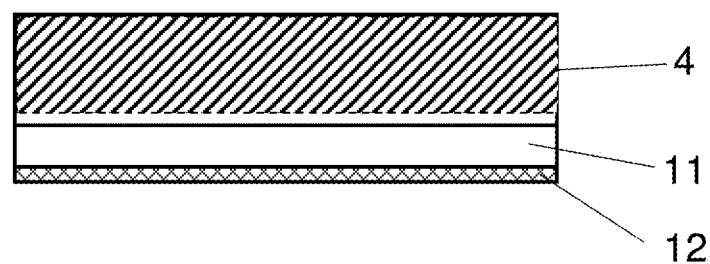
FIG. 5 shows a highly schematic view of the connection to a second semiconductor substrate to produce RC snubber members.

The proposed method is also suitable for producing RC snubber members. In this case, in addition to the semiconductor capacitors, the corresponding resistance must also be produced. This can be accomplished in the proposed method by bonding the semiconductor substrate 4 with the hole structures before separating into the individual components onto a lower-doped semiconductor substrate 11, as is shown highly schematically in FIG. 5. In addition, a second metallization (12) can be applied to the second semiconductor substrate (11) on the backside thereof. In this figure, the region with the hole structures is merely shown hatched. The doping of this second semiconductor substrate is selected in this case so that the desired resistance value is achieved. The following table shows examples of the serial resistance RESR for various second substrates (e.g. 400 µm thick) with different resistivity ρ at 5 nF/10 mm2. The first value corresponds to the conditions without a second substrate (only capacitor).

| | ρ in Ωcm | | | | | | |
|---|---|---|---|---|---|---|---|
| | 0 | 0.5 | 1.0 | 3.0 | 10 | 30 | 100 |
| $R_{ESR}$ in Ω | 0.1 | 0.3 | 0.5 | 1.3 | 4.1 | 12 | 40 |

A further possibility for producing RC snubber members consists in depositing a poorly conductive layer—depending on the required series resistance—on the rear side of the semiconductor substrate before separating into the individual components. Here it is also possible to select the temperature dependence of the resistance in a targeted manner or deposit a multilayer system for compensation of the temperature dependence. Examples of suitable layer materials are ceramics, metal layers, amorphous silicon etc. with high thermal conductivity. The following table here again gives examples of the serial resistance $R_{ESR}$ for various layers (e.g. 4 µm thick) having different resistivity ρ at 5 nF/10 mm$^2$. The first value again corresponds to the conditions without the additional resistance layer (only capacitor).

| | ρ in Ωcm | | | | | | |
|---|---|---|---|---|---|---|---|
| | 0 | 50 | 100 | 300 | 1k | 3k | 10k |
| $R_{ESR}$ in Ω | 0.1 | 0.3 | 0.5 | 1.3 | 4.1 | 12 | 40 |

REFERENCE LIST

1 Group of holes
2 Dividing regions
3 Subregions
4 Semiconductor substrate
5 Holes
6 Dielectric
7 Metal
8 Insulation layer
9 Metallization
10 Further holes
11 Second semiconductor substrate

The invention claimed is:

1. A method for producing semiconductor capacitors having different capacitance values in a semiconductor substrate comprising:
   in a first production phase independently of the semiconductor capacitors to be produced in the semiconductor substrate:
      a hole structure comprising several groups of holes is produced in the semiconductor substrate, which several groups of holes are distributed over the semiconductor substrate and wherein each of the several groups of holes are separated from one another by means of a plurality of identifiable dividing regions, each dividing region having a width which is greater than a spacing of the holes within the several groups of holes, and
      the hole structure is filled with a layer sequence of a dielectric and an electrically conductive layer as an upper electrode of the semiconductor capacitor to be produced, wherein the layer sequence also extends between the holes and several groups of holes and each of the several groups of holes forms a first capacitance and
   in a second production phase depending on the semiconductor capacitors to be produced in said semiconductor substrate:
      a plurality of subregions of said semiconductor substrate are specified, each subregion defining an area in which semiconductor capacitors having identical capacitance values are to be produced, wherein the capacitance values of the semiconductor capacitors of the plurality of subregions differ,
      the layer sequence is structured and a metallization is applied structured or is applied and then structured, wherein the structuring and the application of the metallization are accomplished so that within subregion each the semiconductor capacitors are formed depending on the desired identical capacitance values of the corresponding subregion either in each case by one of a first capacitances or by electric parallel connection of several of the first capacitances and
      the semiconductor capacitors of each subregion are separated by separating the semiconductor substrate along a plurality of dividing lines which run within the plurality of subregions;
   wherein after formation and before the separation of the semiconductor capacitors, the semiconductor substrate is connected to a second semiconductor substrate of lower doping than the semiconductor substrate and a second metallization is applied to the second semiconductor substrate on a back side thereof, so that RC members are obtained by the separation.

2. The method according to claim 1, characterized in that the dividing regions extend rectilinearly over the entire semiconductor substrate.

* * * * *